(12) United States Patent
Aratake et al.

(10) Patent No.: US 12,087,599 B2
(45) Date of Patent: Sep. 10, 2024

(54) SUBSTRATE PROCESSING APPARATUS AND APPARATUS CLEANING METHOD

(71) Applicant: Tokyo Electron Limited, Tokyo (JP)

(72) Inventors: Hidemasa Aratake, Koshi (JP); Osamu Kuroda, Koshi (JP); Kouzou Kanagawa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 624 days.

(21) Appl. No.: 17/072,158

(22) Filed: Oct. 16, 2020

(65) Prior Publication Data

US 2021/0118704 A1 Apr. 22, 2021

(30) Foreign Application Priority Data

Oct. 17, 2019 (JP) .................... 2019-189858

(51) Int. Cl.
*H01L 21/67* (2006.01)
*B08B 3/04* (2006.01)
*B08B 3/14* (2006.01)
*H01L 21/02* (2006.01)

(52) U.S. Cl.
CPC ........ *H01L 21/67057* (2013.01); *B08B 3/048* (2013.01); *B08B 3/14* (2013.01); *H01L 21/02057* (2013.01); *H01L 21/67253* (2013.01)

(58) Field of Classification Search
CPC ..... B08B 3/048; B08B 3/14; H01L 21/02057; H01L 21/67017; H01L 21/67057; H01L 21/67253
See application file for complete search history.

(56) References Cited

U.S. PATENT DOCUMENTS

| | | | | |
|---|---|---|---|---|
| 2002/0036005 A1* | 3/2002 | Kimura | ............. | H01L 21/67034 134/186 |
| 2002/0092547 A1* | 7/2002 | You | ................... | H01L 21/67057 134/186 |
| 2003/0234029 A1* | 12/2003 | Bergman | ................ | B08B 3/102 134/32 |
| 2009/0246968 A1* | 10/2009 | Nakajima | ................. | B08B 3/08 134/25.4 |
| 2013/0048034 A1* | 2/2013 | Maegawa | ......... | H01L 21/67057 134/104.2 |

FOREIGN PATENT DOCUMENTS

| | | |
|---|---|---|
| JP | H03-038827 A | 2/1991 |
| JP | H06-310487 A | 11/1994 |
| JP | 2015-220318 A | 12/2015 |
| JP | 2018-125516 A | 8/2018 |

* cited by examiner

*Primary Examiner* — Douglas Lee
(74) *Attorney, Agent, or Firm* — Pearne & Gordon LLP

(57) ABSTRACT

A substrate processing apparatus includes a processing tub, a storage, a liquid recovery unit, a storage drain line and a liquid recovery unit drain line. The processing tub is allowed to accommodate therein multiple substrates, and configured to store therein a processing liquid. The storage is connected to the processing tub, and configured to store therein the processing liquid drained from the processing tub. The liquid recovery unit is configured to receive the processing liquid overflown from the processing tub. The storage drain line is configured to drain a liquid stored in the storage. The liquid recovery unit drain line is configured to drain a liquid received from the liquid recovery unit to an external drain line provided at an outside.

16 Claims, 11 Drawing Sheets

SUBSTRATE PROCESSING APPARATUS AND APPARATUS CLEANING METHOD

CROSS-REFERENCE TO RELATED APPLICATION

This application claims the benefit of Japanese Patent Application No. 2019-189858 filed on Oct. 17, 2019, the entire disclosures of which are incorporated herein by reference.

TECHNICAL FIELD

The various aspects and embodiments described herein pertain generally to a substrate processing apparatus and an apparatus cleaning method.

BACKGROUND

Conventionally, there is known a batch processing of processing a plurality of substrates belonging to a single lot all at once by immersing the lot in a processing tub in which a processing liquid is stored.

Patent Document 1: Japanese Patent Laid-open Publication No. H03-038827

SUMMARY

In an exemplary embodiment, a substrate processing apparatus includes a processing tub, a storage, a liquid recovery unit, a storage drain line and a liquid recovery unit drain line. The processing tub is allowed to accommodate therein multiple substrates, and configured to store therein a processing liquid. The storage is connected to the processing tub, and configured to store therein the processing liquid drained from the processing tub. The liquid recovery unit is configured to receive the processing liquid overflown from the processing tub. The storage drain line is configured to drain a liquid stored in the storage. The liquid recovery unit drain line is configured to drain a liquid received from the liquid recovery unit to an external drain line provided at an outside.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
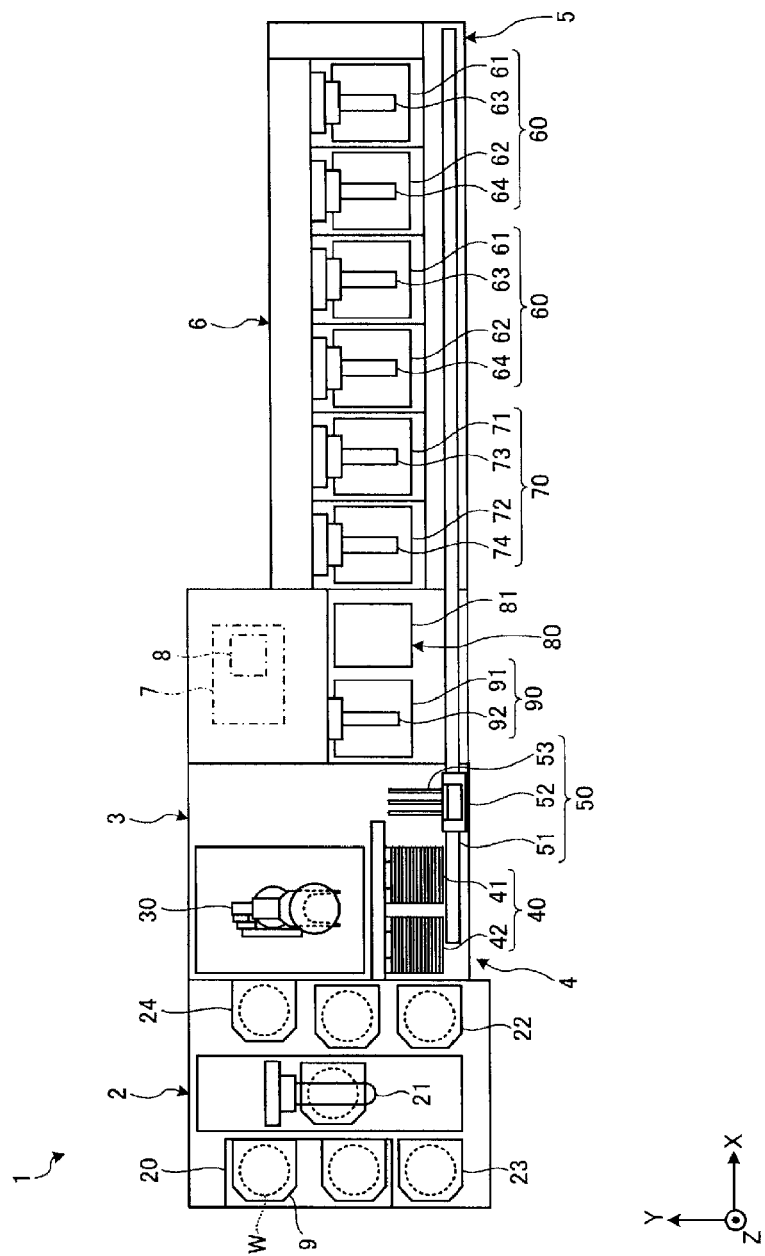
FIG. 1 is a plan view of a substrate processing apparatus according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments for a substrate processing apparatus and an apparatus cleaning method according to the present disclosure (hereinafter, referred to as "exemplary embodiments") will be described in detail with reference to the accompanying drawings. Further, it should be noted that the substrate processing apparatus and the apparatus cleaning method according to the present disclosure are not limited to the exemplary embodiments. Unless processing contents are not contradictory, the disclosures in the various exemplary embodiments can be combined appropriately. Further, in the various exemplary embodiments to be described below, same parts will be assigned same reference numerals, and redundant description will be omitted.

Further, in the various accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction.

First Exemplary Embodiment

<Configuration of Substrate Processing Apparatus>

First, a configuration of a substrate processing apparatus according to a first exemplary embodiment will be described with reference to FIG. 1. FIG. 1 is a plan view of a substrate processing apparatus 1 according to the first exemplary embodiment.

As illustrated in FIG. 1, the substrate processing apparatus 1 according to the first exemplary embodiment includes a carrier carry-in/out unit 2, a lot forming unit 3, a lot placing unit 4, a lot transferring unit 5, a lot processing unit 6 and a controller 7.

The carrier carry-in/out unit 2 is equipped with a carrier stage 20, a carrier transfer mechanism 21, carrier stocks 22 and 23, and a carrier placing table 24.

The carrier stage 20 places a plurality of carriers 9 transferred from the outside. Each of the carriers 9 is a container configured to accommodate a plurality (e.g., twenty five sheets) of wafers W vertically arranged in a horizontal posture. The carrier transfer mechanism 21 transfers each of the carriers 9 between the carrier stage 20, the carrier stocks 22 and 23 and the carrier placing table 24.

A plurality of wafers W before being processed is carried out from the carrier 9 placed on the carrier placing table 24 to the lot processing unit 6 by a substrate transfer mechanism 30 to be described later. Further, a plurality of wafers W after being processed is carried into the carrier 9 placed on the carrier placing table 24 from the lot processing unit 6 by the substrate transfer mechanism 30.

The lot forming unit 3 is equipped with the substrate transfer mechanism 30 to form a lot. The lot is formed of a plurality (e.g., fifty sheets) of wafers W to be processed simultaneously by combining wafers W accommodated in one or more carriers 9. The wafers W in the lot is arranged with their plate surfaces facing each other at a predetermined interval.

The substrate transfer mechanism 30 transfers the wafers W between the carrier 9 placed on the carrier placing table 24 and the lot placing unit 4.

The lot placing unit 4 is equipped with a lot placing table 40 to temporarily place (stand by) a lot to be transferred between the lot forming unit 3 and the lot processing unit 6 by the lot transferring unit 5. The lot placing table 40 is equipped with a carry-in side lot placing table 41 on which a lot before being processed, which is formed by the lot forming unit 3, is placed; and a carry-out side lot placing table 42 on which a lot after being processed by the lot processing unit 6 is placed. On the carry-in side lot placing table 41 and the carry-out side lot placing table 42, the wafers W corresponding to a single lot is arranged side by side in an upright posture.

The lot transferring unit 5 is equipped with a lot transferring mechanism 50 to transfer the lot between the lot placing unit 4 and the lot processing unit 6 or within the lot processing unit 6. The lot transferring mechanism 50 is equipped with a rail 51, a moving body 52 and a substrate holder 53.

The rail 51 is placed along the lot placing unit 4 and the lot processing unit 6 in the X-axis direction. The moving body 52 is configured to be movable along the rail 51 while holding the wafers W. The substrate holder 53 is provided on the moving body 52 to hold the wafers W arranged side by side in the upright posture.

The lot processing unit 6 performs an etching processing, a cleaning processing, and a drying processing to the wafers W arranged side by side in the upright posture as a single lot. In the lot processing unit 6, two etching apparatuses 60, a cleaning apparatus 70, a substrate holder cleaning apparatus 80 and a drying apparatus 90 are provided along the rail 51.

The etching apparatus 60 is configured to perform the etching processing on the lot. The cleaning apparatus 70 is configured to perform the cleaning processing on the lot. The substrate holder cleaning apparatus 80 is configured to perform the cleaning processing on the substrate holder 53. The drying apparatus 90 is configured to perform the drying processing on the lot. Here, the numbers of the etching apparatuses 60, the cleaning apparatus 70, the substrate holder cleaning apparatus 80 and the drying apparatus 90 is not limited to the example illustrated in FIG. 1.

Each of the etching apparatuses 60 includes a processing tub 61 for etching, a processing tub 62 for rinsing, and substrate elevating devices 63 and 64.

The processing tub 61 can accommodate the wafers W for the single lot arranged in the upright posture, and store a processing liquid for etching (hereinafter, also referred to as "etching liquid") therein. Details of the processing tub 61 will be described below.

The processing tub 62 stores a processing liquid for rinsing (pure water or the like) therein. In each of the substrate elevating devices 63 and 64, the wafers W belonging to the lot are held as arranged side by side in the upright posture.

The etching apparatus 60 is configured to hold, with the substrate elevating device 63, the lot transferred by the lot transferring unit 5 and perform the etching processing by immersing the lot in the etching liquid in the processing tub 61. The etching processing is performed for, e.g., from about 1 hour to about 3 hours.

The lot after being etched in the processing tub 61 is transferred by the lot transferring unit 5 to the processing tub 62. Then, the etching apparatus 60 holds the transferred lot with the substrate elevating device 64 and performs the rinsing processing by immersing the lot in the rinsing liquid in the processing tub 62. The lot after being rinsed in the processing tub 62 is transferred by the lot transferring unit 5 to a processing tub 71 of the cleaning apparatus 70.

The cleaning apparatus 70 is equipped with the processing tub 71 for cleaning, a processing tub 72 for rinsing and substrate elevating devices 73 and 74. The processing tub 71 for cleaning stores a processing liquid for cleaning (e.g., SC-1 (a mixed solution of ammonia, hydrogen peroxide and water) or the like) therein.

The processing tub 72 for rinsing stores a processing liquid for rinsing (pure water or the like) therein. In each of the substrate elevating devices 73 and 74, the wafers W belonging to the single lot are held as arranged side by side in the upright posture.

The cleaning apparatus 70 is configured to hold, with the substrate elevating device 73, the lot transferred by the lot transferring unit 5 and perform the cleaning processing by immersing the lot in a cleaning liquid in the processing tub 71.

The lot after being cleaned in the processing tub 71 is transferred by the lot transferring unit 5 to the processing tub 72. Then, the cleaning apparatus 70 is configured to hold the transferred lot with the substrate elevating device 74 and perform the rinsing processing by immersing the lot in the rinsing liquid in the processing tub 72. The lot after being rinsed in the processing tub 72 is transferred by the lot transferring unit 5 to a processing tub 91 of the drying apparatus 90.

The drying apparatus 90 is equipped with the processing tub 91 and a substrate elevating device 92. The processing tub 91 is supplied with a processing gas for drying (e.g., isopropyl alcohol (IPA) or the like). In the substrate elevating device 92, the wafers W belonging to the single lot are held as arranged side by side in the upright posture.

The drying apparatus 90 is configured to hold, with the substrate elevating device 92, the lot transferred by the lot transferring unit 5 and perform the drying processing with the processing gas for drying supplied into the processing tub 91. The lot after being dried in the processing tub 91 is transferred by the lot transferring unit 5 to the lot placing unit 4.

The substrate holder cleaning apparatus 80 is configured to perform the cleaning processing on the substrate holder 53 by supplying the processing liquid for cleaning to the substrate holder 53 of the lot transferring mechanism 50 and supplying the drying gas.

The controller 7 controls the operations of the respective units (the carrier carry-in/out unit 2, the lot forming unit 3, the lot placing unit 4, the lot transferring unit 5, the lot processing unit 6 and the like) of the substrate processing apparatus 1. The controller 7 controls the operations of the respective units of the substrate processing apparatus 1 based on signals from a switch or various sensors.

The controller 7 is, e.g., a computer, and includes a computer-readable storage medium 8. The storage medium 8 stores a program for controlling various processings that are executed in the substrate processing apparatus 1.

The controller 7 reads and executes the program stored in the storage medium 8 to control the operations of the substrate processing apparatus 1. Further, the program may be a program that has been stored in the computer-readable storage medium 8 and may be installed in the storage medium 8 of the controller 7 from the other storage medium.

Examples of the computer-readable storage medium 8 include a hard disc (HD), a flexible disc (FD), a compact disc (CD), a magnet optical disc (MO), and a memory card.

<Configuration of Processing Tub for Etching>

Figure 2:
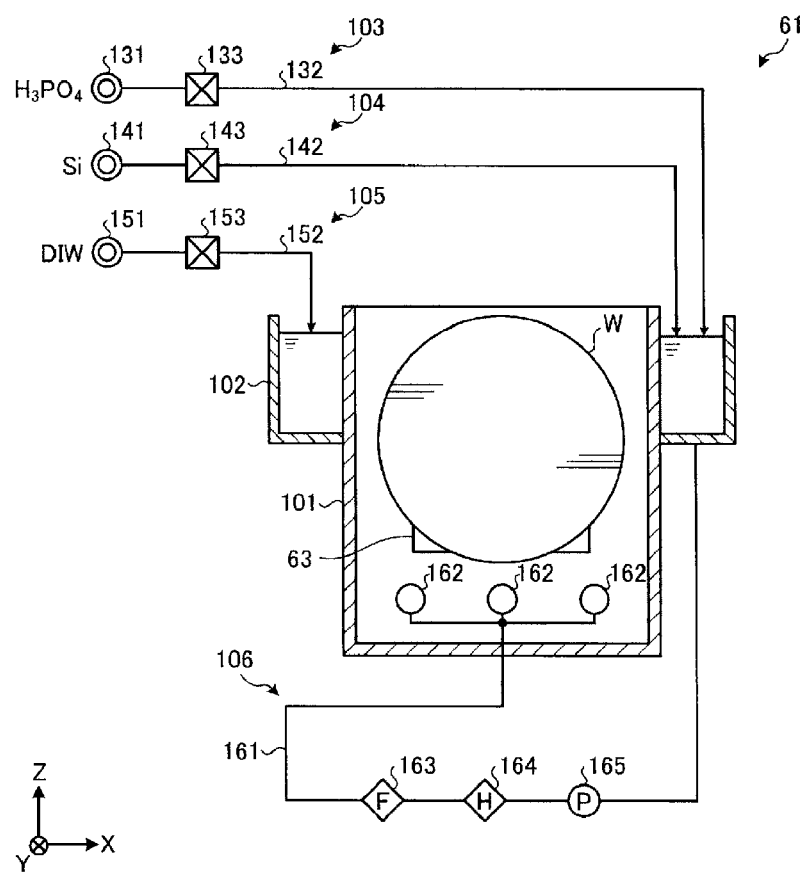
FIG. 2 is a block diagram illustrating a configuration of a processing tub for etching according to the first exemplary embodiment.

Hereinafter, the processing tub 61 for etching will be described with reference to FIG. 2. FIG. 2 is a block diagram illustrating a configuration of a processing tub 61 for etching according to the first exemplary embodiment.

In the processing tub 61, the etching processing of selectively etching a silicon nitride film (SiN) between the silicon nitride film and a silicon oxide film ($SiO_2$) formed on the wafer W with a predetermined etching liquid is performed. In the etching processing, a solution in which a silicon (Si)-containing compound is added to a phosphoric acid ($H_3PO_4$) aqueous solution to adjust the silicon concentration is used as the etching liquid.

As a method of adjusting the silicon concentration in the etching liquid, a method of immersing a dummy substrate in the phosphoric acid aqueous solution and dissolving silicon (seasoning) or a method of dissolving a silicon-containing compound, such as colloidal silica, in the phosphoric acid aqueous solution can be used. Otherwise, the silicon concentration may be adjusted by adding a silicon-containing compound aqueous solution into the phosphoric acid aqueous solution.

As illustrated in FIG. 2, the processing tub 61 for etching includes an inner tub 101 and an outer tub 102. The inner tub 101 is a box-shaped tub whose top is opened and stores the etching liquid therein. The lot formed of the wafers W is immersed in the inner tub 101. The outer tub 102 has an open top and is placed around an upper portion of the inner tub 101. The outer tub 102 is supplied with the etching liquid overflowing from the inner tub 101.

Further, the processing tub 61 includes a phosphoric acid aqueous solution supply 103, a silicon supply 104 and a DIW supply 105.

The phosphoric acid aqueous solution supply 103 includes a phosphoric acid aqueous solution source 131, a phosphoric acid aqueous solution supply line 132 and a flow rate controller 133.

The phosphoric acid aqueous solution source 131 is configured to supply the phosphoric acid aqueous solution in which phosphoric acid is concentrated to a desired concentration. The phosphoric acid aqueous solution supply line 132 connects the phosphoric acid aqueous solution source 131 and the outer tub 102 to supply the phosphoric acid aqueous solution from the phosphoric acid aqueous solution source 131 to the outer tub 102.

The flow rate controller 133 is provided at the phosphoric acid aqueous solution supply line 132 to control a supply amount of the phosphoric acid aqueous solution to be supplied to the outer tub 102. The flow rate controller 133 includes an opening/closing valve, a flow rate control valve, a flowmeter and the like.

The silicon supply 104 includes a silicon source 141, a silicon supply line 142, and a flow rate controller 143.

The silicon source 141 is a tank configured to store the silicon-containing compound aqueous solution. The silicon supply line 142 connects the silicon source 141 and the outer tub 102 to supply the silicon-containing compound aqueous solution from the silicon source 141 to the outer tub 102.

The flow rate controller 143 is provided at the silicon supply line 142 to control a supply amount of the silicon-containing compound aqueous solution to the outer tub 102. The flow rate controller 143 includes an opening/closing valve, a flow rate control valve, a flowmeter and the like. Since the supply amount of the silicon-containing compound aqueous solution is controlled by the flow rate controller 143, the silicon concentration in the etching liquid can be adjusted.

The DIW supply 105 includes a DIW source 151, a DIW supply line 152 and a flow rate controller 153. The DIW supply 105 is configured to supply the deionized water (DIW: pure water) to the outer tub 102 to replenish water vaporized by heating the etching liquid.

The DIW supply line 152 connects the DIW source 151 and the outer tub 102 to supply the DIW having a predetermined temperature from the DIW source 151 to the outer tub 102.

The flow rate controller 153 is provided at the DIW supply line 152 to control a supply amount of the DIW to the outer tub 102. The flow rate controller 153 includes an opening/closing valve, a flow rate control valve, a flowmeter and the like. Since the supply amount of the DIW is controlled by the flow rate controller 153, the temperature of the etching liquid and the phosphoric acid concentration and the silicon concentration in the etching liquid can be adjusted.

Furthermore, the processing tub 61 includes a circulation unit 106. The circulation unit 106 circulates the etching liquid between the inner tub 101 and the outer tub 102. The circulation unit 106 includes a circulation line 161, a plurality of processing liquid supply nozzles 162, a filter 163, a heater 164, and a pump 165.

The circulation line 161 connects the outer tub 102 and the inner tub 101. One end of the circulation line 161 is connected to the outer tub 102 and the other end of the circulation line 161 is connected to the processing liquid supply nozzles 162 placed within the inner tub 101.

The filter 163, the heater 164 and the pump 165 are provided at the circulation line 161. The filter 163 is configured to remove impurities from the etching liquid flowing in the circulation line 161. The heater 164 is configured to heat the etching liquid flowing in the circulation line 161 to a temperature suitable for the etching processing. The pump 165 is configured to send the etching liquid within the outer tub 102 to the circulation line 161. The pump 165, the heater 164 and the filter 163 are provided in this sequence from the upstream side.

The circulation unit 106 is configured to supply the etching liquid from the outer tub 102 into the inner tub 101 via the circulation line 161 and the processing liquid supply nozzles 162. The etching liquid supplied into the inner tub 101 overflows from the inner tub 101 and flows back into the outer tub 102. Accordingly, the etching liquid circulates between the inner tub 101 and the outer tub 102.

Further, the circulation unit 106 may set the etching liquid in a boiling state by heating the etching liquid with the heater 164.

<Configuration Around Processing Tub>

Figure 3:
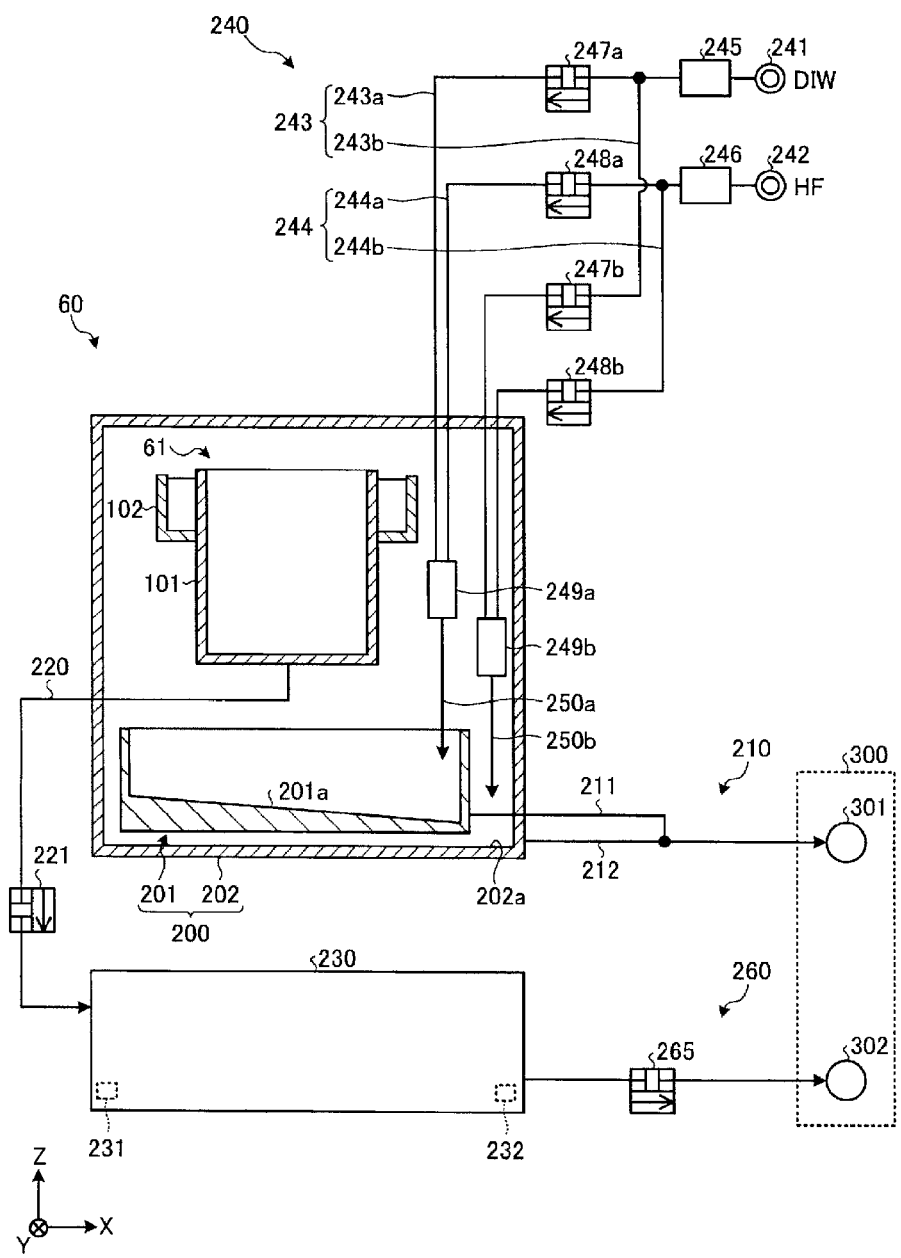
FIG. 3 is a diagram illustrating a configuration of an etching apparatus according to the first exemplary embodiment.

Now, a configuration around the processing tub 61 will be explained with reference to FIG. 3. FIG. 3 is a diagram illustrating a configuration of the etching apparatus 60 according to the first exemplary embodiment.

As depicted in FIG. 3, the etching apparatus 60 is equipped with a liquid recovery unit 200, a liquid recovery unit drain line 210, a processing tub drain line 220, a cooling tank 230, a cleaning unit 240, and a tank drain line 260.

The liquid recovery unit 200 is a receptacle which receives the etching liquid overflown from the processing tub 61. The liquid recovery unit 200 includes a first liquid recovery unit 201 and a second liquid recovery unit 202. Further, the term "etching liquid overflown from the processing tub 61" refers to the etching liquid coming out of the inner tub 101 or the outer tub 102 by being overflown, scattered or leaking from the inner tub 101 or the outer tub 102. By way of example, if the etching liquid in a boiling state is stored in the processing tub 61, the etching liquid may be scattered to an outside of the processing tub 61 by boiling.

The first liquid recovery unit 201 is disposed under the processing tub 61. The first liquid recovery unit 201 is, for example, a saucer-shaped receptacle, and receives a droplet of the etching liquid falling from the processing tub 61 by being overflown or leaking from the processing tub 61, for example.

The second liquid recovery unit 202 has a larger volume than the first liquid recovery unit 201. The second liquid recovery unit 202 is a box-shaped receptacle, and accommodates therein the processing tub 61 and the first liquid recovery unit 201. The second liquid recovery unit 202 receives the etching liquid scattered from the processing tub 61 by, for example, boiling.

A first liquid recovery unit drain line 211 through which the etching liquid received in the first liquid recovery unit 201 is drained from the first liquid recovery unit 201 is connected to a lower portion of a lateral side of the first liquid recovery unit 201. In the example shown in FIG. 3, the first liquid recovery unit drain line 211 is connected to a lower portion of a lateral side of the first liquid recovery unit 201 at a positive X-axis side.

A bottom surface 201a of the first liquid recovery unit 201 is inclined downwards toward the first liquid recovery unit drain line 211. That is, a negative X-axis side of the bottom surface 201a of the first liquid recovery unit 201 is higher than a positive X-axis side thereof. With this configuration, the etching liquid received by the first liquid recovery unit 201 can be drained from the first liquid recovery unit 201 efficiently. Further, the etching liquid can be suppressed from remaining within the first liquid recovery unit 201.

A second liquid recovery unit drain line 212 through which the etching liquid received in the second liquid recovery unit 202 is drained from the second liquid recovery unit 202 is connected to a lower portion of a lateral side of the second liquid recovery unit 202. In the example shown in FIG. 3, the second liquid recovery unit drain line 212 is connected to a lower portion of a lateral side of the second liquid recovery unit 202 at a positive X-axis side.

The liquid recovery unit drain line 210 connects the liquid recovery unit 200 and a first external drain line 301, and drains the etching liquid received by the liquid recovery unit 200 into the first external drain line 301. The liquid recovery unit drain line 210 is branched into the aforementioned first liquid recovery unit drain line 211 and second liquid recovery unit drain line 212 at an upstream side. The first liquid recovery unit drain line 211 is connected to the first liquid recovery unit 201, and the second liquid recovery unit drain line 212 is connected to the second liquid recovery unit 202. Further, the liquid recovery unit drain line 210 is connected to the first external drain line 301 at a downstream side. The first external drain line 301 is one of equipments 300 provided in a building such as a factory in which the substrate processing apparatus 1 is disposed. To elaborate, the first external drain line 301 is an acid-based liquid drain line for draining an acid-based liquid as a waste liquid.

Further, the liquid recovery unit drain line 210 may be equipped with first liquid recovery unit drain line 211 and the second liquid recovery unit drain line 212 which are independent from each other. In this case, the first liquid recovery unit drain line 211 and the second liquid recovery unit drain line 212 only need to be connected to the first external drain line 301 at a downstream side.

The processing tub drain line 220 connects the processing tub 61, specifically, the inner tub 101 and the cooling tank 230. The processing tub drain line 220 drains the etching liquid stored in the inner tub 101 into the cooling tank 230. An opening/closing valve 221 configured to open or close the processing tub drain line 220 is provided at a portion of the processing tub drain line 220.

The cooling tank 230 is connected to the processing tub 61 via the processing tub drain line 220, and temporarily stores therein the etching liquid drained from the processing tub 61. The cooling tank 230 is equipped with a cooling mechanism such as, but not limited to, a coil tube, and thus capable of cooling the etching liquid of a high temperature stored therein.

The cooling tank 230 is also equipped with a liquid surface detector 231. The liquid surface detector 231 is configured to detect a liquid surface within the cooling tank 230. By way of example, the liquid surface detector 231 is provided near a bottom surface of the cooling tank 230. As the liquid surface detector 231 is located at this bottom position, if the liquid surface is not detected by the liquid surface detector 231, it means that a liquid is not or hardly stored in the cooling tank 230. Further, the cooling tank 230 may be equipped with another liquid surface detector which is provided near a ceiling of the cooling tank 230. By providing the liquid surface detector at this ceiling position, a state in which the cooling tank 230 is filled with the liquid can be detected.

Furthermore, the cooling tank 230 is provided with a temperature detector 232. The temperature detector 232 is configured to detect a temperature of the liquid within the cooling tank 230.

The tank drain line 260 is connected to the cooling tank 230 at an upstream side and connected to a second external drain line 302 at a downstream side. The tank drain line 260 drains the etching liquid stored in the cooling tank 230 into the second external drain line 302. The second external line 302 is one of the equipments 300. To elaborate, the second external drain line 302 is a recovery line configured to collect the etching liquid drained from the processing tub 61 to reuse it.

A tank opening/closing valve 265 is provided at a portion of the tank drain line 260. The tank opening/closing valve 265 is configured to open or close the tank drain line 260.

The etching liquid may be stored in the processing tub 61 in a boiling state. In this case, an organic-based additive contained in the etching liquid turns into a vapor and is emitted to an outside of the processing tub 61, adhering to the liquid recovery unit 200 or the liquid recovery unit drain line 210. This vapor contains silicon, and the additive mixed with this silicon is gelated on the liquid recovery unit 200 or within the liquid recovery unit drain line 210 and more dried, ending up being fixed on the liquid recovery unit 200 or within the liquid recovery unit drain line 210 as a crystal. As a result, the liquid recovery unit drain line 210 may be blocked.

Meanwhile, the additive mixed with the silicon emitted from the processing tub 61 by evaporation is not mixed into the processing tub drain line 220, the cooling tank 230 and the tank drain line 260. For this reason, as compared to the liquid recovery unit drain line 210, the tank drain line 260 may not be clogged with the crystal produced from the etching liquid.

Thus, in the etching apparatus 60 according to the first exemplary embodiment, a liquid drain path from the liquid recovery unit 200 including the liquid recovery unit drain line 210 and a liquid drain path from the cooling tank 230 including the tank drain line 260 are configured to be separate from each other. Accordingly, the liquid in which the additive mixed with the silicon may be mixed can be suppressed from being introduced into the tank drain line 260 from the liquid recovery unit drain line 210. Therefore, the tank drain line 260 can be suppressed from being clogged with the crystal of the additive mixed with the silicon.

As stated above, according to the etching apparatus 60 of the first exemplary embodiment, clogging of a liquid drain line (tank drain line 260) can be suppressed.

The etching apparatus 60 according to the first exemplary embodiment is equipped with the cleaning unit 240 configured to remove the crystal adhering to the liquid drain path from the liquid recovery unit 200. The cleaning unit 240 supplies a cleaning liquid for cleaning the liquid recovery unit 200 and the liquid recovery unit drain line 210 to the liquid recovery unit 200.

The cleaning unit 240 is equipped with a DIW source 241 and a HF source 242. The DIW source 241 is configured to supply DIW. The HF source 242 is configured to supply HF (hydrogen fluoride in a liquid state).

Further, the cleaning unit 240 is equipped with a DIW supply line 243, a HF supply line 244, a DIW flow rate controller 245, a HF flow rate controller 246, a first DIW opening/closing valve 247a, a second DIW opening/closing valve 247b, a first HF opening/closing valve 248a, and a second HF opening/closing valve 248b. Further, the cleaning unit 240 is equipped with a first mixer 249a, a second mixer 249b, a first discharge line 250a, and a second discharge line 250b.

The DIW supply line 243 is connected to the DIW source 241. The DIW supply line 243 is branched into a first DIW supply line 243a and a second DIW supply line 243b. The first DIW supply line 243a is connected to the first mixer 249a via the first DIW opening/closing valve 247a. The second DIW supply line 243b is connected to the second mixer 249b via the second DIW opening/closing valve 247b.

The HF supply line 244 is connected to the HF source 242. The HF supply line 244 is branched into a first HF supply line 244a and a second HF supply line 244b. The first HF supply line 244a is connected to the first mixer 249a via the first HF opening/closing valve 248a. The second HF supply line 244b is connected to the second mixer 249b via the second HF opening/closing valve 248b.

The DIW flow rate controller 245 is provided upstream of a branch point between the first DIW supply line 243a and the second DIW supply line 243b of the DIW supply line 243, and configured to adjust a flow rate of the DIW flowing in the DIW supply line 243. The HF flow rate controller 246 is provided upstream of a branch point between the first HF supply line 244a and the second HF supply line 244b of the HF supply line 244, and configured to adjust a flow rate of the HF flowing in the HF supply line 244.

The first DIW opening/closing valve 247a is provided at a portion of the first DIW supply line 243a and configured to open or close the first DIW supply line 243a. The second DIW opening/closing valve 247b is provided at a portion of the second DIW supply line 243b and configured to open or close the second DIW supply line 243b. The first HF opening/closing valve 248a is provided at a portion of the first HF supply line 244a and configured to open or close the first HF supply line 244a. The second HF opening/closing valve 248b is provided at a portion of the second HF supply line 244b and configured to open or close the second HF supply line 244b.

The first mixer 249a is connected to the first DIW supply line 243a and the first HF supply line 244a at an upstream side. The first mixer 249a is configured to mix the DIW supplied from the DIW source 241 through the first DIW supply line 243a and the HF supplied from the HF source 242 through the first HF supply line 244a.

The second mixer 249b is connected to the second DIW supply line 243b and the second HF supply line 244b at an upstream side. The second mixer 249b is configured to mix the DIW supplied from the DIW source 241 through the second DIW supply line 243b and the HF supplied from the HF source 242 through the second HF supply line 244b.

The first discharge line 250a is connected to the first mixer 249a at an upstream side, and configured to discharge DHF (dilute hydrofluoric acid), which is a mixed solution of the DIW and the HF generated by the first mixer 249a, toward the bottom surface 201a of the first liquid recovery unit 201. Further, when the first DIW opening/closing valve 247a is opened and the first HF opening/closing valve 248a is closed, the first discharge line 250a is capable of discharging the DIW. Furthermore, when the first DIW opening/closing valve 247a is closed and the first HF opening/closing valve 248a is opened, the first discharge line 250a is capable of discharging the HF.

The second discharge line 250b is connected to the second mixer 249b at an upstream side, and configured to discharge DHF generated by the second mixer 249b toward the bottom surface 202a of the second liquid recovery unit 202. Further, when the second DIW opening/closing valve 247b is opened and the second HF opening/closing valve 248b is closed, the second discharge line 250b is capable of discharging the DIW. Furthermore, when the second DIW opening/closing valve 247b is closed and the second HF opening/closing valve 248b is opened, the second discharge line 250b is capable of discharging the HF.

The HF included in the cleaning liquid is capable of dissolving the silicon-based crystal such as the additive mixed with the silicon supplied from the processing tub 61 by being evaporated or the $SiO_2$ precipitated from the etching liquid due to a temperature decrease thereof as will be described later. Accordingly, by supplying the DHF as the cleaning liquid to the liquid recovery unit 200, the silicon-based crystal adhering to the liquid recovery unit 200 can be dissolved and removed from the liquid recovery unit 200. Further, the cleaning liquid supplied to the liquid recovery unit 200 flows through the liquid recovery unit drain line 210. Accordingly, by supplying the DHF as the cleaning liquid to the liquid recovery unit 200, the silicon-based crystal adhering to the liquid recovery unit drain line 210 can be dissolved and removed from the liquid recovery unit drain line 210.

As stated above, the etching apparatus 60 according to the first exemplary embodiment is capable of dissolving the silicon-based crystal adhering to the liquid recovery unit 200 and the liquid recovery unit drain line 210 by supplying the cleaning liquid including the HF to the liquid recovery unit 200. Therefore, in the etching apparatus 60 according to the first exemplary embodiment, clogging of the liquid drain path for the etching liquid, specifically, the liquid recovery unit drain line 210 can be suppressed.

<Sequence of Cleaning Processing>

Figure 4:
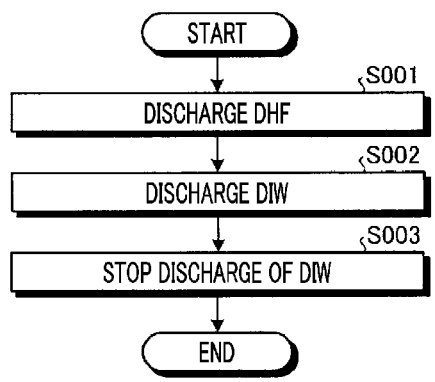
FIG. 4 is a flowchart illustrating a sequence of a cleaning processing according to the first exemplary embodiment.

FIG. 4 is a flowchart illustrating a processing sequence of a cleaning processing according to the first exemplary embodiment. The etching apparatus 60 performs the processing sequence shown in FIG. 4 under the control of the controller 7.

As depicted in FIG. 4, the etching apparatus 60 first discharges DHF to the liquid recovery unit 200 (process S001). To elaborate, the etching apparatus 60 opens the first DIW opening/closing valve 247a, the second DIW opening/closing valve 247b, the first HF opening/closing valve 248a, and the second HF opening/closing valve 248b. Accordingly, DIW and HF are supplied to the first mixer 249a, and DHF mixed by the first mixer 249a is supplied to the first liquid recovery unit 201 from the first discharge line 250a. Further, the DIW and the HF are supplied to the second mixer 249b as well, and DHF mixed by the second mixer 249b is supplied to the second liquid recovery unit 202 from the second discharge line 250b.

Subsequently, the etching apparatus 60 closes the first HF opening/closing valve 248a and the second HF opening/closing valve 248b, thus allowing the DIW to be discharged to the liquid recovery unit 200 (process S002). Then, the etching apparatus 60 closes the first DIW opening/closing valve 247a and the second DIW opening/closing valve 247b, thus stopping the discharge of the DIW to the liquid recovery unit 200 (process S003) and ending the cleaning processing.

As stated above, the etching apparatus 60 may finish the cleaning processing of discharging the DIW to the liquid recovery unit 200 after discharging the DHF to the liquid recovery unit 200. Accordingly, the DHF can be suppressed from remaining in the liquid recovery unit 200 and the liquid recovery unit drain line 210.

Figure 5:
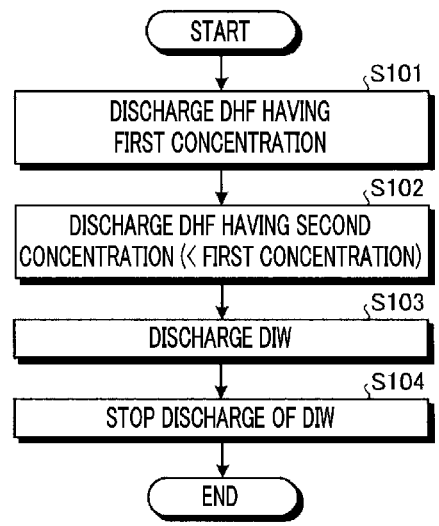
FIG. 5 is a flowchart illustrating a sequence of a cleaning processing according to a first modification example.
Figure 6:
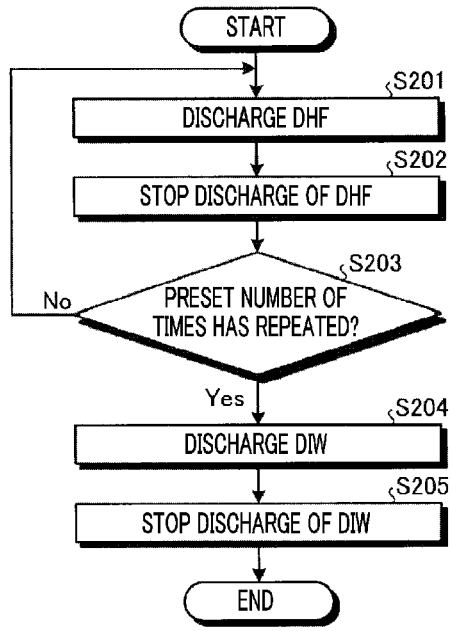
FIG. 6 is a flowchart illustrating a sequence of a cleaning processing according to a second modification example.
Figure 7:
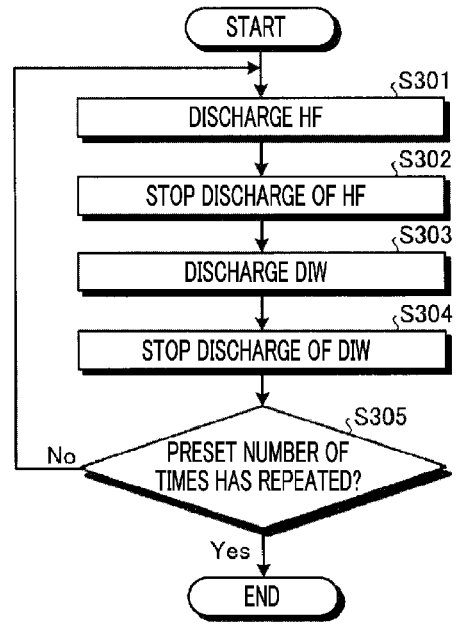
FIG. 7 is a flowchart illustrating a sequence of a cleaning processing according to a third modification example.

Subsequently, other examples of the above-described cleaning processing will be discussed with reference to FIG. 5 to FIG. 7. FIG. 5 is a flowchart illustrating a processing sequence of a cleaning processing according to a first modification example. FIG. 6 is a flowchart illustrating a processing sequence of a cleaning processing according to a second modification example. FIG. 7 is a flowchart illustrating a processing sequence of a cleaning processing according to a third modification example. Further, the etching apparatus 60 performs the processing sequences shown in FIG. 5 to FIG. 7 under the control of the controller 7.

As depicted in FIG. 5, the etching apparatus 60 first opens the respective opening/closing valves 247a, 247b, 248a and 248b, thus allowing DHF having a first concentration to be discharged to the first liquid recovery unit 201 and the second liquid recovery unit 202 (process S101). The DHF having the first concentration is obtained by adjusting flow rates of DIW and HF by using the DIW flow rate controller 245 and the HF flow rate controller 246.

Subsequently, the etching apparatus 60 discharges DHF having a second concentration lower than the first concentration to the first liquid recovery unit 201 and the second liquid recovery unit 202 (process S102). By way of example, the etching apparatus 60 may produce the DHF having the second concentration by changing the flow rate ratios of the DIW and the HF by using the DIW flow rate controller 245 and the HF flow rate controller 246.

As stated above, the etching apparatus 60 may first discharge the DHF having the first concentration with a relatively high HF concentration to the liquid recovery unit 200, and then discharge the DHF having the second concentration with a relatively low HF concentration to the liquid recovery unit 200. Accordingly, it is possible to clean the liquid recovery unit 200 and the liquid recovery unit drain line 210 efficiently while suppressing consumption of HF.

Thereafter, the etching apparatus 60 closes the first HF opening/closing valve 248a and the second HF opening/closing valve 248b, thus allowing the DIW to be discharged to the first liquid recovery unit 201 and the second liquid recovery unit 202 (process S103). Then, the etching apparatus 60 closes the first DIW opening/closing valve 247a and the second DIW opening/closing valve 247b, thus stopping the discharge of the DIW to the first liquid recovery unit 201 and the second liquid recovery unit 202 (process S104) and ending the cleaning processing.

As another example, the etching apparatus 60 first opens the respective opening/closing valves 247a, 247b, 248a and 248b, thus allowing DHF to be discharged to the first liquid recovery unit 201 and the second liquid recovery unit 202 (process S201), as shown in FIG. 6. Then, the etching apparatus 60 closes the respective opening/closing valves 247a, 247b, 248a and 248b, thus stopping the discharge of the DHF to the first liquid recovery unit 201 and the second liquid recovery unit 202 (process S202).

Subsequently, the etching apparatus 60 determines whether a processing of the processes S201 to S202 has been repeated a preset number of times (process S203). In this process, if a repetition number of the processing of the processes S201 and S202 has not reached the preset number of times (process S203, No), the etching apparatus 60 returns to the process S201 and repeats the processing of the processes S201 and S202.

Meanwhile, assume that the repetition number of the processing of the processes S201 and S202 has reached the preset number of times (process S203, Yes). In this case, the etching apparatus 60 closes the first HF opening/closing valve 248a and the second HF opening/closing valve 248b, thus allowing DIW to be discharged to the first liquid recovery unit 201 and the second liquid recovery unit 202 (process S204). Then, the etching apparatus 60 closes the first DIW opening/closing valve 247a and the second DIW opening/closing valve 247b, thus stopping the discharge of the DIW to the first and second liquid recovery units 201 and 202 (process S205) and ending the cleaning processing.

As described above, the etching apparatus 60 may discharge the DHF to the liquid recovery unit 200 intermittently. As compared to a case where the DHF is discharged continuously, a flow of the DHF may be disturbed. As a consequence, a physical force for removing a silicon-based crystal from the liquid recovery unit 200 or the like can be enhanced.

Further, the etching apparatus 60 may also repeat the processing of the processes S204 and S205 a preset number of times. That is, the etching apparatus 60 may discharge the DIW intermittently as well as the DHF. In this case, the etching apparatus 60 may set an interval between a stopping of the discharge of the DIW and a resuming of the discharge of the DIW to be shorter than an interval between a stopping of the discharge of the DHF and a resuming of the discharge of the DHF. Accordingly, the DHF can be more securely suppressed from remaining in the liquid recovery unit 200 and the liquid recovery unit drain line 210.

As still another example, the etching apparatus 60 first opens the first HF opening/closing valve 248a and the second HF opening/closing valve 248b, thus allowing HF to be discharged to the first liquid recovery unit 201 and the second liquid recovery unit 202 (process S301), as shown in FIG. 7. Then, the etching apparatus 60 closes the first HF opening/closing valve 248a and the second HF opening/closing valve 248b, thus stopping the discharge of the HF to the first and second liquid recovery units 201 and 202 (process S302).

Subsequently, the etching apparatus 60 closes the first HF opening/closing valve 248a and the second HF opening/closing valve 248b, and opens the first DIW opening/closing valve 247a and the second DIW opening/closing valve 247b. Accordingly, the etching apparatus 60 discharges DIW to the first liquid recovery unit 201 and the second liquid recovery unit 202 (process S303). Thereafter, the etching apparatus 60 closes the first DIW opening/closing valve 247a and the second DIW opening/closing valve 247b, thus stopping the discharge of the DIW to the first liquid recovery unit 201 and the second liquid recovery unit 202 (process S304).

Next, the etching process 60 determines whether a processing of the processes S301 to S304 has been repeated a preset number of times (process S305). In this process, if a repetition number of the processing of the processes S301 to S304 has not reached the preset number of times (process S305, No), the etching apparatus 60 returns to the process S301, and repeats the processing of the processes S301 to S304. Meanwhile, if it is determined in the process S305 that the repetition number of the processing of the processes S301 to S304 has reached the preset number of times (process S305, Yes), the etching apparatus 60 ends the cleaning processing.

As stated above, the etching apparatus 60 may discharge the HF and the DIW to the liquid recovery unit 200 alternately. In this case, as the HF and the DIW are mixed in the liquid recovery unit 200, DHF can be produced in the liquid recovery unit 200.

Further, here, the DIW is discharged to the liquid recovery unit 200 after the HF is discharged thereto. However, the etching apparatus 60 may discharge the HF to the liquid recovery unit 200 after discharging the DIW thereto. In this case, after it is determined in the process S305 that the repetition number has reached the preset number of times, the cleaning processing may be ended after the DIW is discharged to the liquid recovery unit 200 for a preset time period.

<Operation Example of Tank Draining Processing>

Figure 8:
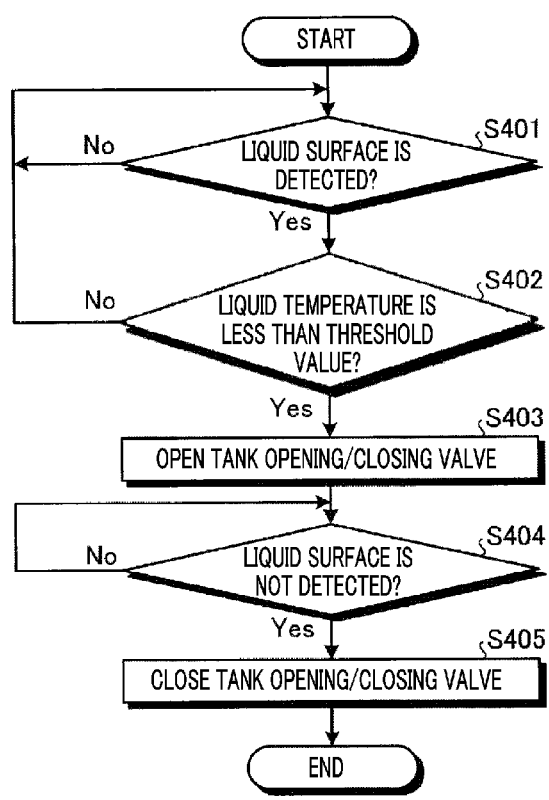
FIG. 8 is a flowchart illustrating a sequence of a tank draining processing according to the first exemplary embodiment.

Now, an operation example of a tank draining processing of draining the etching liquid stored in the cooling tank 230 into the second external drain line 302 will be discussed with reference to FIG. 8. FIG. 8 is a flowchart illustrating a processing sequence of the tank draining processing according to the first exemplary embodiment. Further, the etching apparatus 60 performs the processing sequence shown in FIG. 8 under the control of the controller 7.

As depicted in FIG. 8, the controller 7 determines whether the liquid surface within the cooling tank 230 has been detected by the liquid surface detector 231 (process S401). If it is determined that the liquid surface has been detected by the liquid surface detector 231 (process S401: Yes), the controller 7 then determines whether the liquid temperature within the cooling tank 230 detected by the temperature detector 232 is less than a threshold value (process S402). If it is determined that the liquid temperature is less than the threshold value (process S402: Yes), the controller 7 opens the tank opening/closing valve 265 (process S403), thus allowing the etching liquid stored in the cooling tank 230 to be drained into the second external drain line 302 via the tank drain line 260. Meanwhile, if it is determined in the process S401 that the liquid surface has not been detected by the liquid surface detector 231 (process S401: No) or if it is determined in the process S402 that the liquid temperature is equal to or higher than the threshold value (process S402: No), the controller 7 returns the processing back to the process S401.

By way of example, if the opening/closing valve 221 (see FIG. 3) is opened to replace the liquid within the processing tub 61, a large quantity of the etching liquid stored in the processing tub 61 is flown into the cooling tank 230 at once. Accordingly, there is created a state in which the liquid surface is detected by the liquid surface detector 231. Further, since the etching liquid stored in the processing tub 61 is of a high temperature, the liquid temperature detected by the temperature detector 232 becomes equal to or higher than the threshold value. Accordingly, at this point, the tank opening/closing valve 265 is not opened. Afterwards, if the etching liquid within the cooling tank 230 is cooled by the cooling mechanism provided in the cooling tank 230, the liquid temperature detected by the temperature detector 232 falls below the threshold value. Then, the tank opening/closing valve 265 is opened, so that the etching liquid within the cooling tank 230 is drained into the second external drain line 302 via the tank drain line 260.

As stated above, in the etching apparatus 60, the high-temperature etching liquid drained from the processing tub 61 is sent into the second external drain line 302, which is one of the equipments 300, after being cooled in the cooling tank 230. Further, a sequence of the processes S401 and S402 may be reversed.

Upon the completion of the processing of the process S403, the controller 7 determines whether there is created a state in which the liquid surface within the cooling tank 230 is not detected by the liquid surface detector 231 (process S404). If it is determined that there is created the state in which the liquid surface is not detected by the liquid surface detector 231 (process S404: Yes), the controller 7 closes the tank opening/closing valve 265 (process S405). Meanwhile, if the liquid surface has been detected by the liquid surface detector 231 (process S404: No), the controller 7 returns the processing back to the process S404 and repeats the determination processing of the process S404 until the liquid surface is not detected. Upon the completion of the processing of the process S405, the controller 7 ends the tank draining processing.

Second Exemplary Embodiment

Figure 9:
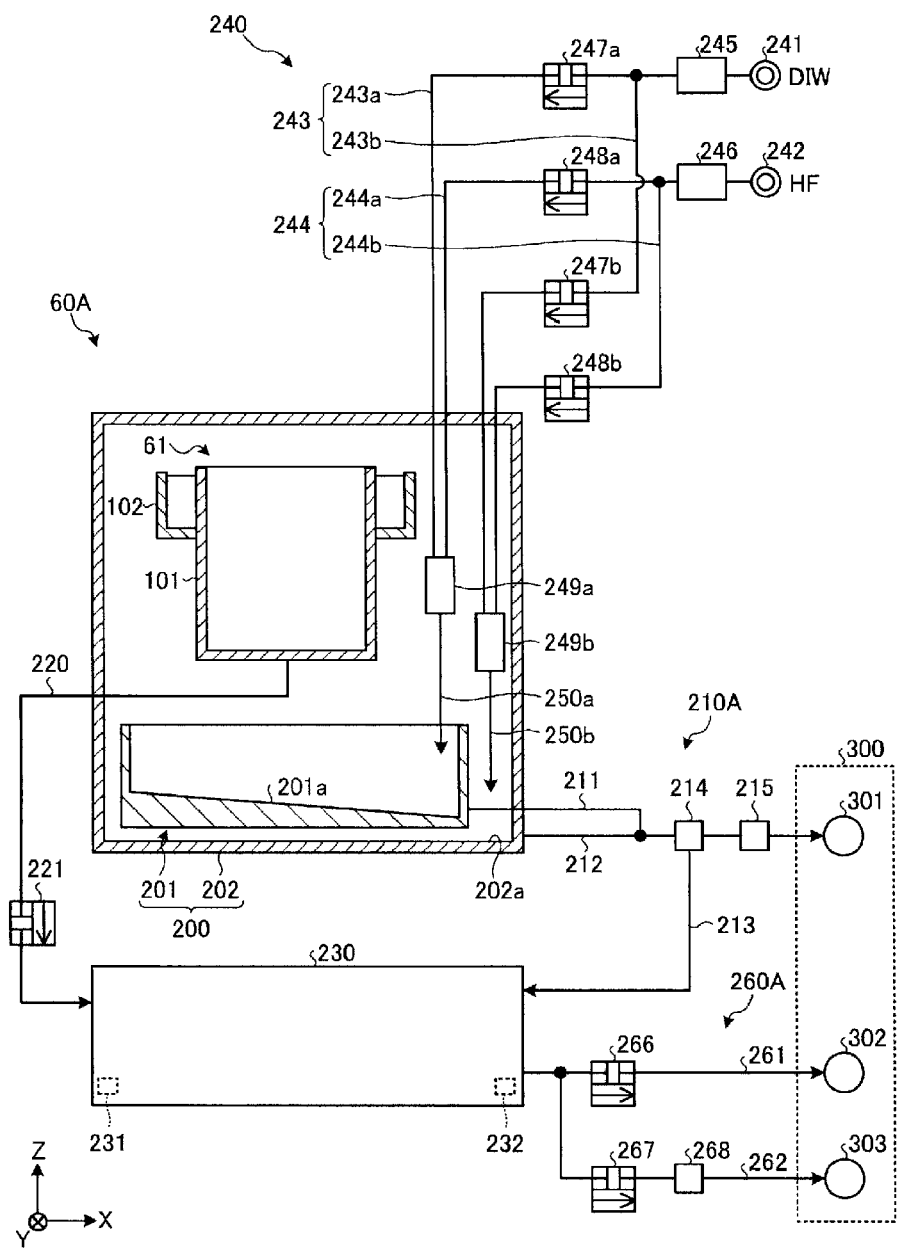
FIG. 9 is a diagram illustrating a configuration of an etching apparatus according to a second exemplary embodiment.

Now, a configuration of an etching apparatus according to a second exemplary embodiment will be explained with reference to FIG. 9. FIG. 9 is a diagram illustrating the configuration of the etching apparatus according to the second exemplary embodiment.

As depicted in FIG. 9, an etching apparatus 60A according to the second exemplary embodiment is equipped with a liquid recovery unit drain line 210A and a tank drain line 260A.

The liquid recovery unit drain line 210A is equipped with a branch line 213, a switching unit 214, and a temperature detector 215.

The branch line 213 is configured to connect a portion of the liquid recovery unit drain line 210A and the cooling tank 230, and drains a liquid flowing in the liquid recovery unit drain line 210A into a cooling tank 230. To elaborate, the branch line 213 is provided downstream of a junction of a first liquid recovery unit drain line 211 and a second liquid recovery unit drain line 212.

The switching unit 214 is configured to switch a flow destination of the liquid flowing in the liquid recovery unit drain line 210A between a first external drain line 301 and the cooling tank 230. The temperature detector 215 is configured to detect a temperature of the liquid flowing in the liquid recovery unit drain line 210A. Based on a detection result by the temperature detector 215, the controller 7 controls the switching unit 214 to switch the flow destination of the liquid from the first external drain line 301 to the cooling tank 230 if the liquid temperature within the liquid recovery unit drain line 210A exceeds a threshold value. As a result, the liquid of a high temperature can be suppressed from being flown into the first external drain line 301.

Here, though the temperature detector 215 is provided downstream of the switching unit 214, the temperature detector 215 may be provided upstream of the switching unit 214.

The tank drain line 260A is equipped with a first tank drain line 261 and a second tank drain line 262. The first tank drain line 261 connects the cooling tank 230 and a second external drain line 302. A first tank opening/closing valve 266 configured to open or close the first tank drain line 261 is provided at a portion of the first tank drain line 261.

The second tank drain line 262 is connected to the first tank drain line 261 at an upstream side and connected to a third external drain line 303 at a downstream side. The second tank drain line 262 drains the liquid stored in the cooling tank 230 into the third external drain line 303. The third external drain line 303 is one of the equipments 300. To elaborate, like the first external drain line 301, the third external drain line 303 is an acid-based liquid drain line for draining an acid-based liquid as a waste liquid. Further, the second tank drain line 262 may be connected to the first external drain line 301.

The second tank drain line 262 is equipped with a second tank opening/closing valve 267 and a cooler 268. The second tank opening/closing valve 267 is configured to open or close the second tank drain line 262. The cooler 268 is configured to cool the liquid flowing in the second tank drain line 262 by supplying, for example, cooling water to an inside of the second tank drain line 262.

As stated above, in the etching apparatus 60A according to the second exemplary embodiment, the liquid recovery unit drain line 210A is branched, and the branch line 213 is connected to the cooling tank 230. With this configuration, a cleaning liquid supplied from a cleaning unit 240 can be supplied to the cooling tank 230 via the liquid recovery unit drain line 210A and the branch line 213, so that the cooling tank 230 and the tank drain line 260A can be cleaned by using this cleaning liquid.

If a temperature of an etching liquid decreases, a silicon-containing compound (for example, $SiO_2$) dissolved in the etching liquid may be precipitated. Accordingly, there is a concern that a crystal originated from the etching liquid may adhere to, for example, the cooling tank 230 and/or the tank drain line 260A. According to the etching apparatus 60A of the second exemplary embodiment, since the cooling tank 230 and the tank drain line 260A can be cleaned with the cleaning liquid, clogging of the tank drain line 260A as well as clogging of the liquid recovery unit drain line 210A can be suppressed.

Further, in the etching apparatus 60A according to the second exemplary embodiment, the cleaning liquid introduced into the cooling tank 230 can be drained into the third external drain line 303 through the second tank drain line 262. Thus, the cleaning liquid can be suppressed from being mixed into the etching liquid which is collected from the cooling tank 230 through the first tank drain line 261 to be used again.

Figure 10:
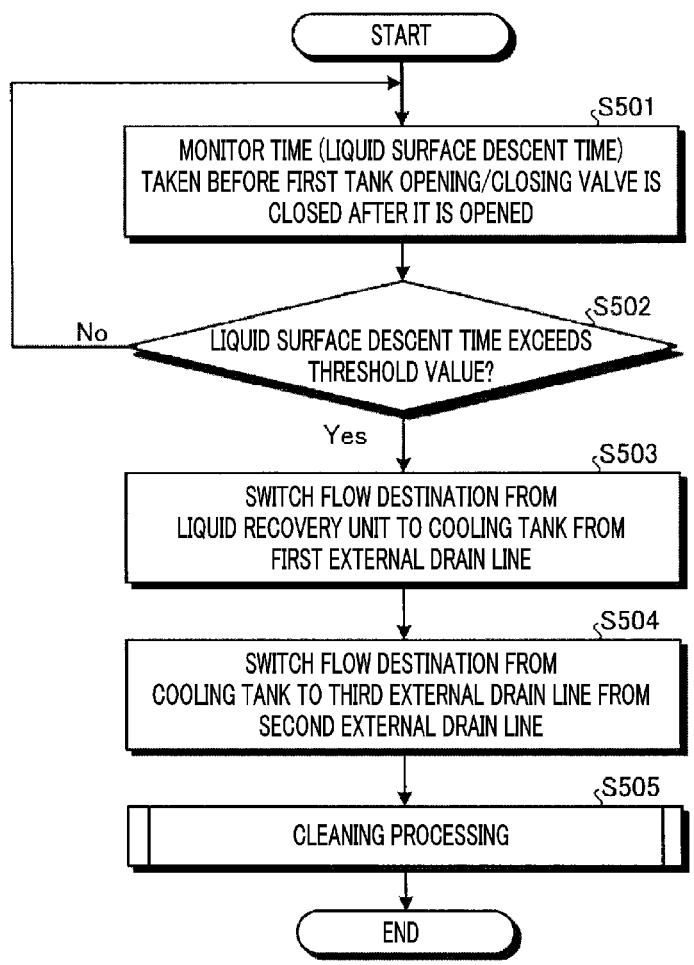
FIG. 10 is a flowchart illustrating a sequence of a tank cleaning processing according to the second exemplary embodiment.

Now, a sequence of a cleaning processing according to the second exemplary embodiment will be described. First, a processing sequence of a tank cleaning processing of cleaning the tank drain line 260A will be first explained with reference to FIG. 10. FIG. 10 is a flowchart illustrating the processing sequence of the tank cleaning processing according to the second exemplary embodiment. The etching apparatus 60A performs the processing sequence shown in FIG. 10 under the control of the controller 7.

As depicted in FIG. 10, the controller 7 monitors a time taken before the first tank opening/closing valve 266 is closed after it is opened (process S501). To elaborate, the first tank opening/closing valve 266 corresponds to the tank opening/closing valve 265 of the first exemplary embodiment, and is opened only when a liquid surface within the cooling tank 230 is detected by a liquid surface detector 231 and the liquid temperature detected by the temperature detector 232 is less than the threshold value. The first tank opening/closing valve 266 is closed when the liquid surface within the cooling tank 230 is no more detected by the liquid surface detector 231. That is, the controller 7 monitors the time taken before the first tank opening/closing valve 266 is closed after it is opened as a time taken before the drainage of the etching liquid within the cooling tank 230 is completed. Hereinafter, this time will be referred to as "liquid surface descent time."

As stated above, the cooling tank 230 stores therein the etching liquid drained from a processing tub 61. An amount of the etching liquid drained from the processing tub 61 is almost same each time. Thus, if the tank drain line 260A is not blocked, the liquid surface descent time is almost same each time.

Thereafter, the controller 7 determines whether the liquid surface descent time exceeds a threshold value (process S502). If it is determined that the liquid surface descent time exceeds the threshold value (process S502: Yes), the controller 7 controls the switching unit 214 to switch the flow destination of the liquid flowing in the liquid recovery unit drain line 210A from the first external drain line 301 to the cooling tank 230 (process S503). Further, the controller 7 closes the first tank opening/closing valve 266 and opens the second tank opening/closing valve 267, thus switching the flow destination of the liquid from the cooling tank 230 to the third external drain line 303 from the second external drain line 302 (process S504).

Subsequently, the controller 7 performs a cleaning processing (process S505). To elaborate, the cleaning processing in the process S505 is one of the cleaning processings shown in FIG. 4 to FIG. 7, for example.

As described above, if the liquid surface descent time exceeds the threshold value, the etching apparatus 60A makes a determination that the tank drain line 260A is just about to be blocked, and begins the tank cleaning processing. Accordingly, cleaning of the cooling tank 230 and the tank drain line 260A can be carried out at an appropriate time.

Figure 11:
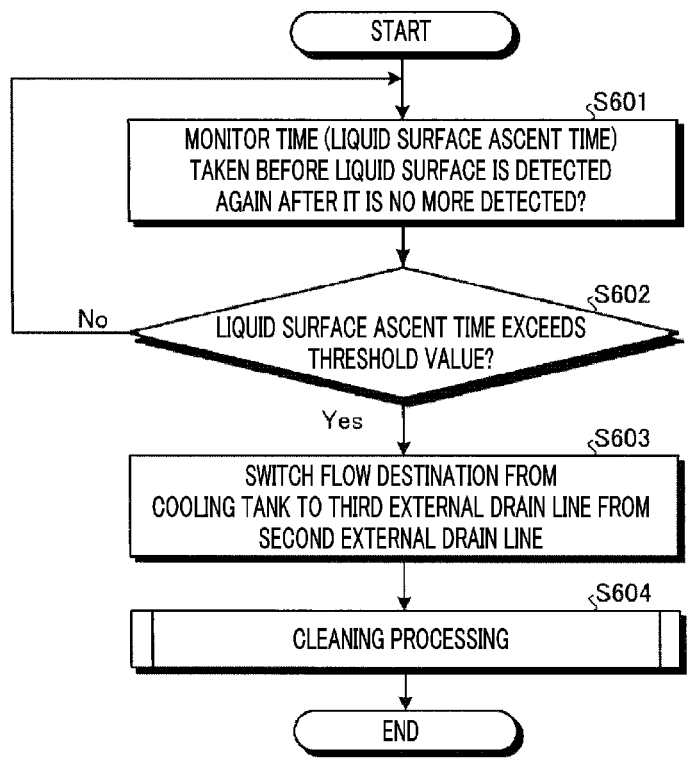
FIG. 11 is a flowchart illustrating a sequence of a branch line cleaning processing according to the second exemplary embodiment.

Now, a branch line cleaning processing of cleaning the branch line 213 will be explained with reference to FIG. 11. FIG. 11 is a processing sequence of the branch line cleaning processing according to the second exemplary embodiment. Further, the etching apparatus 60A performs the processing sequence shown in FIG. 11 under the control of the controller 7.

Here, it is assumed that a flow destination of the liquid drained from the liquid recovery unit 200 is set to be the cooling tank 230 in a usual time when the branch line cleaning processing is not performed. That is, it is assumed that the liquid received by the liquid recovery unit 200 is stored in the cooling tank 230 via the branch line 213. In this case as well, if the liquid surface within the cooling tank 230 is detected by the liquid surface detector 231 and, also, the liquid temperature detected by the temperature detector 232 is less than the threshold value, the first tank opening/closing valve 266 is opened, and the liquid is drained from the cooling tank 230.

As shown in FIG. 11, the controller 7 monitors a time taken before the liquid surface within the cooling tank 230 is detected again after there is created a state in which the liquid surface within the cooling tank 230 is no more detected by the liquid surface detector 231 (process S601). That is, the controller 7 monitors, after the liquid within the cooling tank 230 is drained, a time taken before the liquid surface is detected by the liquid surface detector 231 due to a rise of the liquid surface within the cooling tank 230 caused by the liquid drained through the branch line 213. Hereinafter, this time will be referred to as "liquid surface ascent time." A draining amount of the liquid drained through the branch line 213 per unit time is almost constant. Thus, unless the branch line 213 or the liquid recovery unit drain line 210A is blocked, the liquid surface ascent time may be almost same each time.

Then, the controller 7 determines whether the liquid surface ascent time exceeds a threshold value (process S602). If it is determined that the liquid surface ascent time exceeds the threshold value (process S602: Yes), the controller 7 closes the first tank opening/closing valve 266, and opens the second tank opening/closing valve 267. Through this operation, the controller 7 switches the flow destination of the liquid from the cooling tank 230 to the third external drain line 303 from the second external drain line 302 (process S603).

Subsequently, the controller 7 performs a cleaning processing (process S604). The cleaning processing in this process S604 is one of the cleaning processings shown in FIG. 4 to FIG. 7, for example.

As described above, if the liquid surface ascent time exceeds the threshold value, the etching apparatus 60A makes a determination that the branch line 213 or the liquid recovery unit drain line 210A is just about to be blocked, and begins the branch line cleaning processing. Accordingly, cleaning of the branch line 213 or the liquid recovery unit drain line 210A can be carried out at an appropriate time.

Third Exemplary Embodiment

Figure 12:
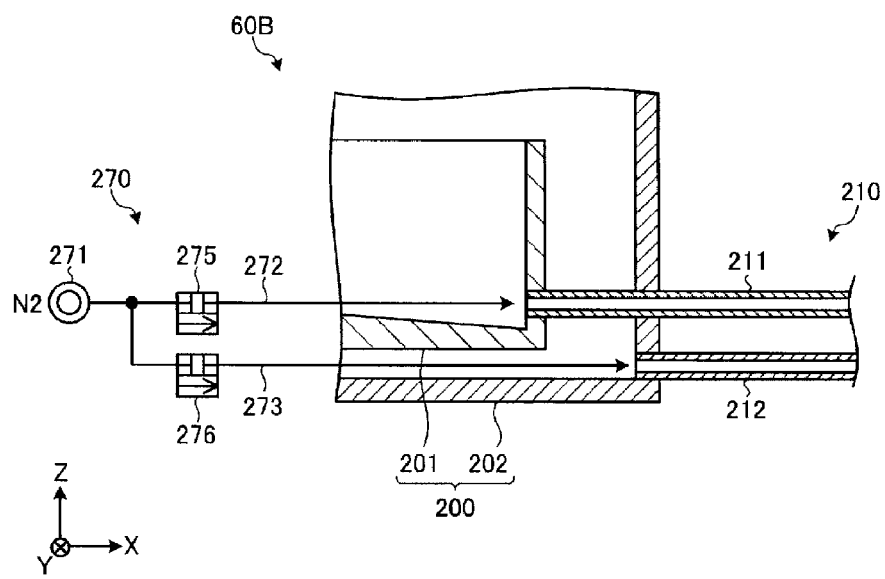
FIG. 12 is a diagram illustrating a configuration of an etching apparatus according to a third exemplary embodiment.

Now, a configuration of an etching apparatus according to a third exemplary embodiment will be described with reference to FIG. 12. FIG. 12 is a diagram illustrating the configuration of the etching apparatus according to the third exemplary embodiment.

As depicted in FIG. 12, an etching apparatus 60B according to the third exemplary embodiment is further equipped with a gas purging unit 270.

The gas purging unit 270 is configured to emit a gas toward an inside of a liquid recovery unit drain line 210. Specifically, the gas purging unit 270 includes a gas source 271, a first supply line 272, a second supply line 273, and opening/closing valves 275 and 276. The gas source 271 is configured to supply, for example, a $N_2$ gas. Further, the gas supplied from the gas source 271 may be air such as dry air, or an inert gas except a $N_2$ gas. The first supply line 272 is connected to the gas source 271 at an upstream side. Further, a downstream end of the first supply line 272 is disposed near an inlet of a first liquid recovery unit drain line 211. The gas supplied from the gas source 271 is injected into the first liquid recovery unit drain line 211 through the first supply line 272.

The second supply line 273 is connected to the gas source 271 at an upstream side. Further, a downstream end of the second supply line 273 is disposed near an inlet of a second liquid recovery unit drain line 212. The gas supplied from the gas source 271 is injected into the second liquid recovery unit drain line 212 through the second supply line 273. An opening/closing valve 275 is provided at a portion of the first supply line 272, and configured to open or close the first supply line 272. Further, an opening/closing valve 276 is provided at a portion of the second supply line 273, and configured to open or close the second supply line 273.

As stated above, in the etching apparatus 60B, the gas is injected into the first liquid recovery unit drain line 211 and the second liquid recovery unit drain line 212 by using the gas purging unit 270. Accordingly, a crystal adhering to the insides of the first and second liquid recovery unit drain lines 211 and 212 can be physically separated from the first and second liquid recovery unit drain lines 211 and 212.

Thus, according to the etching apparatus 60B, clogging of a liquid drain line can be further suppressed.

Fourth Exemplary Embodiment

Figure 13:
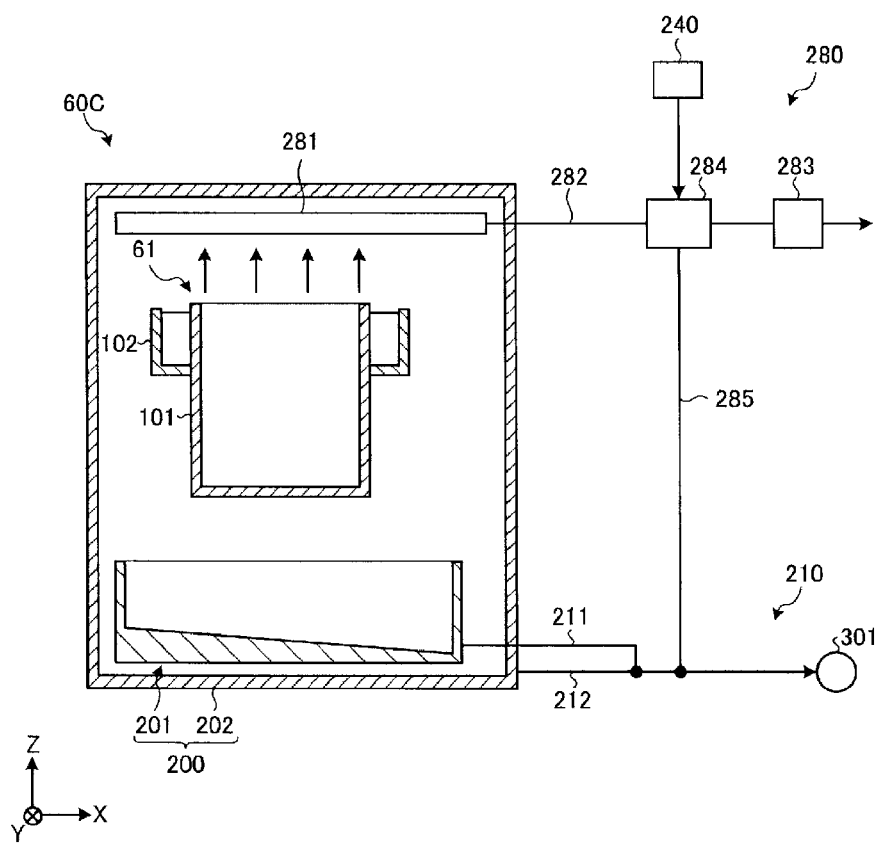
FIG. 13 is a diagram illustrating a configuration of an etching apparatus according to a fourth exemplary embodiment.

Now, a configuration of an etching apparatus according to a fourth exemplary embodiment will be described with reference to FIG. 13. FIG. 13 is a diagram illustrating a configuration of the etching apparatus according to the fourth exemplary embodiment.

As shown in FIG. 13, an etching apparatus 60C according to the fourth exemplary embodiment further includes an exhaust unit 280 configured to evacuate the second liquid recovery unit 202.

The exhaust unit 280 is equipped with a suction member 281 disposed above a processing tub 61 within a second liquid recovery unit 202; an exhaust duct 282 connected to the suction member 281; and a suction device 283 provided at the exhaust duct 282. This exhaust unit 280 sucks in a silicon-mixed additive, which is released from the processing unit 61 in the form of a vapor, by using a suction force generated by the suction device 283, and exhausts the sucked additive to an outside of the second liquid recovery unit 202 through the exhaust duct 282. Accordingly, it is difficult for the silicon-mixed additive to adhere to a first liquid recovery unit 201, the second liquid recovery unit 202 and a liquid recovery unit drain line 210. Therefore, clogging of the liquid recovery unit drain line 210 due to crystallization of the silicon-mixed additive can be suppressed.

A gas-liquid separator 284 configured to separate the vapor flowing in the exhaust duct 282 into a gas and a liquid is provided at a portion of the exhaust unit 280. The gas-liquid separator 284 is connected with the above-stated cleaning unit 240, and a cleaning liquid is supplied from the cleaning unit 240. Further, a drain line 285 is connected to the gas-liquid separator 284. The drain line 285 is connected to the liquid recovery unit drain line 210 at a downstream side, and drains the liquid collected in the gas-liquid separator 284 to the liquid recovery unit drain line 210.

By adopting the above-described configuration, the silicon-mixed additive from the second liquid recovery unit 202 can be suppressed from being crystallized in the exhaust unit 280, so that the clogging of the exhaust duct 282 can be suppressed. Further, as the drain line 285 is connected to the liquid recovery unit drain line 210, a line configuration can be simplified as compared to a case where the gas-liquid separator 284 is directly connected to the first external drain line 301.

Fifth Exemplary Embodiment

Figure 14:
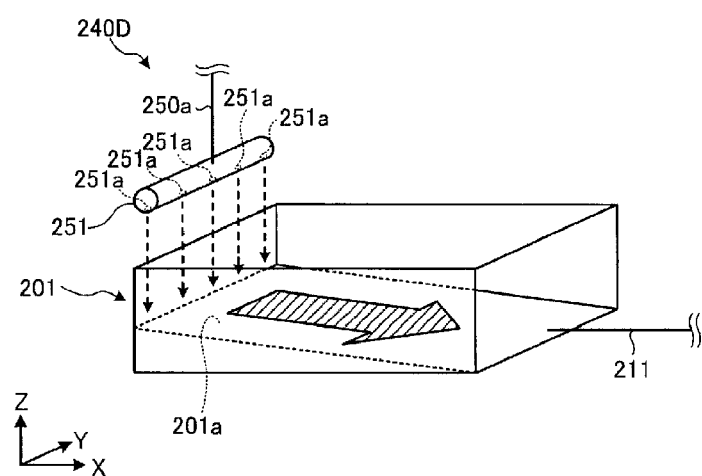
FIG. 14 is a diagram illustrating a configuration of a cleaning unit according to a fourth modification example.
Figure 15:
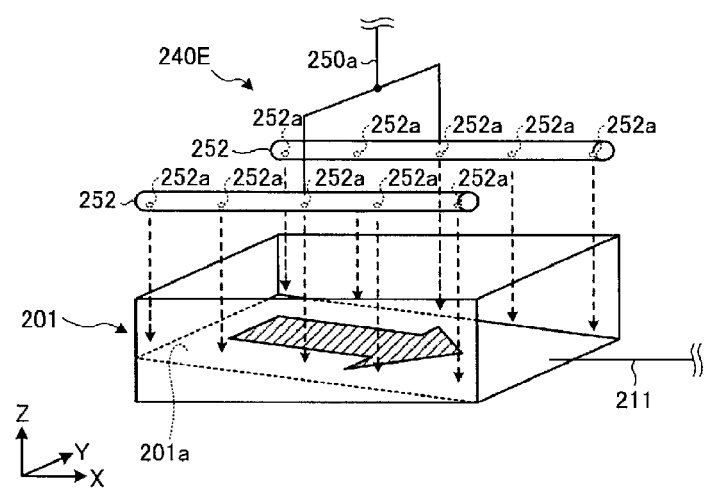
FIG. 15 is a diagram illustrating a configuration of a cleaning unit according to a fifth modification example.

In a fifth exemplary embodiment, a modification example of the cleaning unit will be explained with reference to FIG. 14 and FIG. 15. FIG. 14 is a diagram illustrating a configuration of a cleaning unit according to a fourth modification example. FIG. 15 is a diagram illustrating a configuration of a cleaning unit according to a fifth exemplary embodiment.

As depicted in FIG. 14, a cleaning unit 240D according to the fourth modification example is equipped with a discharge unit 251. The discharge unit 251 is connected to a downstream end of the first discharge line 250a.

The discharge unit 251 is disposed above an upper side of the inclined bottom surface 201a of the first liquid recovery unit 201, that is, above an opposite side from a side where the first liquid recovery unit drain line 211 is provided. By providing the discharge unit 251 at this position, the DHF or the like can be flown along the inclined bottom surface 201a, so that a flow velocity of the DHF or the like can be increased. By increasing the flow velocity of the DHF or the like in this way, a foreign substance adhering to the first liquid recovery unit 201 or the like can be removed more efficiently.

The discharge unit 251 has a multiple number of discharge openings 251a. These discharge openings 251a are arranged along a width direction of the inclined bottom surface 201a (a horizontal direction orthogonal to a horizontal direction in which a slope is extended) (here, Y-axis direction). In this way, by arranging the multiple number of discharge openings 251a along the width direction of the bottom surface 201a, the DHF or the like can be diffused to the first liquid recovery unit 201 uniformly.

As depicted in FIG. 15, a cleaning unit 240E according to the fifth modification example includes a multiple number of discharge units 252. These discharge units 252 are connected to a downstream end of the first discharge line 250a. In the example shown in FIG. 15, the cleaning unit 240E is equipped with two discharge units 252. One of the two discharge units 252 is disposed at one of two opposite sides of the bottom surface 201a in a width direction thereof, and the other of the two discharge units 252 is disposed at the other of the two opposite sides of the bottom surface 201a in the width direction thereof.

Each discharge unit 252 has a multiple number of discharge openings 252a. These discharge openings 252a are arranged along a horizontal direction (a horizontal component of an inclination direction) in which the slope of the bottom surface 201a is extended (here, the X-axis direction). By arranging the multiple number of discharge openings 252a along the inclination direction of the inclined bottom surface 201a, the first liquid recovery unit 201 can be cleaned more efficiently.

As stated above, the substrate processing apparatus (as an example, the etching apparatus 60 (60A to 60C)) according to the exemplary embodiments includes a processing tub (as an example, the processing tub 61), a storage (as an example, the cooling tank 230), a liquid recovery unit (as an example, the liquid recovery unit 200), a storage drain line (as an example, the tank drain line 260), and a liquid recovery unit drain line (as an example, the liquid recovery unit drain line 210). The processing tub is configured to accommodate therein a multiple number of substrates (as an example, wafers W), and stores a processing liquid (as an example, the etching liquid) therein. The storage is connected to the processing tub, and stores therein the processing liquid drained from the processing tub. The liquid recovery unit receives the processing liquid overflown from the processing tub. The storage drain line drains the liquid stored in the storage. The liquid recovery unit drain line drains the liquid received from the liquid recovery unit to an external drain line (as an example, the first external drain line 301) provided at an outside.

Thus, in the substrate processing apparatus according to the exemplary embodiment, clogging of the liquid drain line(s) can be suppressed in the substrate processing apparatus which performs a batch processing.

The processing liquid may contain phosphoric acid and a dissolved silicon-containing compound (as an example, $SiO_2$). If this processing liquid is stored in the processing tub in, for example, a boiling state, silicon may be released from the processing tub along with a vapor, ending up being attached to the liquid recovery unit and the liquid recovery unit drain line as a silicon-based crystal. Meanwhile, since this silicon-mixed vapor is not introduced into the storage and the storage drain line, the storage drain line may be suppressed from being clogged with the silicon-based crystal originated from the processing tub, as compared to the liquid recovery unit drain line. Thus, like the substrate processing apparatus according to the exemplary embodiment, by separating the liquid drain path from the liquid recovery unit including the liquid recovery unit drain line and the liquid drain path from the storage including the storage drain line, clogging of the storage drain line with the silicon-based crystal can be suppressed.

The substrate processing apparatus according to the exemplary embodiments may be further equipped with a branch line (as an example, the branch line 213), a cleaning unit (as an example, the cleaning unit 240), and a switching unit (as an example, the switching unit 214). The branch line connects a portion of the liquid recovery unit drain line and the storage, and drains the liquid flowing in the liquid recovery unit drain line into the storage. The cleaning unit is configured to supply a cleaning liquid for removing a crystal originated from the processing liquid to the liquid recovery unit. The switching unit is configured to switch a flow destination of the liquid flowing in the liquid recovery unit drain line between the external drain line and the storage.

If a temperature of the processing liquid decreases, a silicon-containing compound (for example, $SiO_2$) dissolved in the processing liquid may be precipitated. Accordingly, there is a concern that a silicon-based crystal originated from the processing liquid may adhere to the storage and/or the storage drain line. According to the substrate processing apparatus of the exemplary embodiments, however, since the storage and the storage drain line can be cleaned with the cleaning liquid, clogging of the storage drain line as well as clogging of the liquid recovery unit drain line can be suppressed.

The cleaning liquid may contain a first liquid (as an example, pure water) and a second liquid (as an example, hydrogen fluoride). In this case, the cleaning unit may be equipped with a first liquid supply line (as an example, the DIW supply line 243), a second liquid supply line (as an example, the HF supply line 244), a discharge line (as an example, the first discharge line 250*a* and the second discharge lint 250*b*), a first liquid flow rate controller (as an example, the DIW flow rate controller 245), and a second liquid flow rate controller (as an example, the HF flow rate controller 246). The first liquid supply line supplies the first liquid. The second liquid supply line supplies the second liquid. The discharge line is connected to the first liquid supply line and the second liquid supply line, and supplies the cleaning liquid, the first liquid or the second liquid to the liquid recovery unit. The first liquid flow rate controller is provided at the first liquid supply line, and configured to adjust a flow rate of the first liquid flowing in the first liquid supply line. The second liquid flow rate controller is provided at the second liquid supply line, and configured to adjust a flow rate of the second liquid flowing in the second liquid supply line.

Thus, in the substrate processing apparatus according to the exemplary embodiments, it is possible to clean the liquid recovery unit, the liquid recovery unit drain line, the storage, and the storage drain line by using the cleaning liquid supplied from the cleaning unit. Therefore, clogging of the liquid drain line can be further suppressed.

The first liquid may be pure water, and the second liquid may be hydrogen fluoride. The hydrogen fluoride included in the cleaning liquid, that is, dilute hydrofluoric acid is capable of dissolving, for example, the silicon-based crystal originated from the processing liquid. Thus, by supplying the dilute hydrofluoric acid as the cleaning liquid to the liquid recovery unit, the silicon-based crystal adhering to the liquid recovery unit can be dissolved and removed from the liquid recovery unit. Further, the cleaning liquid supplied to the liquid recovery unit flows through the liquid recovery unit drain line. Therefore, the silicon-based crystal adhering to the liquid recovery unit drain line can be also dissolved and removed.

The substrate processing apparatus according to the exemplary embodiments may include a liquid surface detector (as an example, the liquid surface detector 231) configured to detect a liquid surface within the storage; and a controller (as an example, the controller 7) configured to control the cleaning unit and the switching unit. In this case, the controller monitors a liquid surface descent time within the storage based on a detection result of the liquid surface detector. If the liquid surface descent time exceeds a threshold value, the controller may control the switching unit to switch the flow destination to the storage and control the cleaning unit to supply the cleaning liquid to the liquid recovery unit. Accordingly, cleaning of the storage and the storage drain line can be carried out at an appropriate time.

The substrate processing apparatus according to the exemplary embodiments may include a liquid surface detector (as an example, the liquid surface detector 231) configured to detect a liquid surface within the storage; and a controller (as an example, the controller 7) configured to control the cleaning unit and the switching unit. In this case, in the state that the flow destination is switched to the storage, the controller monitors a liquid surface ascent time within the storage based on a detection result of the liquid surface detector. If the liquid surface ascent time exceeds a threshold value, the controller may control the cleaning unit to supply the cleaning liquid to the liquid recovery unit. Accordingly, cleaning of the branch line and the liquid recovery unit drain line can be carried out at an appropriate time.

The substrate processing apparatus according to the exemplary embodiments may further include a gas purging unit (as an example, the gas purging unit 270) configured to inject a gas toward an inside of the liquid recovery unit drain line. With this configuration, a crystal adhering to the inside of the liquid recovery unit drain line can be physically removed. Thus, clogging of the liquid drain line can be further suppressed.

The liquid recovery unit may include a first liquid recovery unit (as an example, the first liquid recovery unit 201) disposed under the processing tub; and a second liquid recovery unit (as an example, the second liquid recovery unit 202) accommodating therein the processing tub and the first liquid recovery unit. In this configuration, the substrate processing apparatus according to the exemplary embodiments may be further equipped with an exhaust unit (as an example, the exhaust unit 280) configured to evacuate the second liquid recovery unit. By exhausting a silicon-mixed vapor emitted from the processing tub to an outside of the second liquid recovery unit by using the exhaust unit, clogging of the liquid recovery unit drain line can be further suppressed.

According to the exemplary embodiment, it is possible to suppress clogging of a liquid drain line in the substrate processing apparatus configured to perform a batch processing.

The exemplary embodiments disclosed herein are illustrative in all aspects and not limited thereto. In fact, the above exemplary embodiments can be embodied in various forms. Further, the above-described exemplary embodiments may be omitted, substituted, or changed in various forms without departing from the scope of the appended claims.

From the foregoing, it will be appreciated that various exemplary embodiments of the present disclosure have been described herein for the purposes of illustration, and that various modifications may be made without departing from the scope and spirit of the present disclosure. Accordingly, the various exemplary embodiments disclosed herein are not intended to be limiting, with the true scope and spirit being indicated by the following claims.

We claim:

1. A substrate processing apparatus, comprising:
   a processing tub allowed to accommodate therein multiple substrates, and configured to store therein a processing liquid;
   a storage connected to the processing tub, and configured to store therein the processing liquid drained from the processing tub;
   a liquid receiving unit configured to receive the processing liquid overflown from the processing tub;
   a liquid receiving unit drain line configured to drain a liquid received from the liquid receiving unit to a first external drain line provided at an outside of the apparatus;
   a storage drain line configured to drain a liquid stored in the storage to a second external drain line provided at an outside of the apparatus and different from the first external drain line;
   a branch line, connecting a connection portion of the liquid receiving unit drain line with the storage, configured to drain the liquid flowing in the liquid receiving unit drain line to the storage;
   a cleaning unit configured to supply a cleaning liquid to remove a crystal originated from the processing liquid to the liquid receiving unit; and
   a switching unit provided at the connection portion of the liquid receiving unit drain line and configured to switch a flow destination of the liquid flowing in the liquid receiving unit drain line between the external drain line and the storage.

2. The substrate processing apparatus of claim 1, wherein the processing liquid contains phosphoric acid and a dissolved silicon-containing compound.

3. The substrate processing apparatus of claim 2, wherein the cleaning liquid contains a first liquid and a second liquid, and
   wherein the cleaning unit comprises:
   a first liquid supply line configured to supply the first liquid;
   a second liquid supply line configured to supply the second liquid;
   a discharge line connected to the first liquid supply line and the second liquid supply line, and configured to discharge the cleaning liquid, the first liquid or the second liquid toward the liquid receiving unit;
   a first liquid flow rate controller provided at the first liquid supply line, and configured to adjust a flow rate of the first liquid flowing in the first liquid supply line; and
   a second liquid flow rate controller provided at the second liquid supply line, and configured to adjust a flow rate of the second liquid flowing in the second liquid supply line.

4. The substrate processing apparatus of claim 3, wherein the first liquid is pure water, and
   the second liquid is hydrogen fluoride.

5. The substrate processing apparatus of claim 2, further comprising:
   a liquid surface detector configured to detect a liquid surface within the storage; and
   a controller configured to control the cleaning unit and the switching unit,
   wherein the controller monitors a liquid surface descent time within the storage based on a detection result of the liquid surface detector, and, when the liquid surface descent time exceeds a threshold value, the controller controls the switching unit to switch the flow destination to the storage and controls the cleaning unit to supply the cleaning liquid to the liquid receiving unit.

6. The substrate processing apparatus of claim 2, further comprising:
   a gas purging unit configured to discharge a gas toward an inside of the liquid receiving unit drain line.

7. The substrate processing apparatus of claim 2, wherein the liquid receiving unit comprises:
   a first liquid receiving unit disposed under the processing tub; and
   a second liquid receiving unit allowed to accommodate therein the processing tub and the first liquid receiving unit, and
   wherein the substrate processing apparatus further comprises an exhaust unit configured to exhaust the second liquid receiving unit.

8. The substrate processing apparatus of claim 1, wherein the cleaning liquid contains a first liquid and a second liquid, and
   wherein the cleaning unit comprises:
   a first liquid supply line configured to supply the first liquid;
   a second liquid supply line configured to supply the second liquid;
   a discharge line connected to the first liquid supply line and the second liquid supply line, and configured to discharge the cleaning liquid, the first liquid or the second liquid toward the liquid receiving unit;
   a first liquid flow rate controller provided at the first liquid supply line, and configured to adjust a flow rate of the first liquid flowing in the first liquid supply line; and
   a second liquid flow rate controller provided at the second liquid supply line, and configured to adjust a flow rate of the second liquid flowing in the second liquid supply line.

9. The substrate processing apparatus of claim 8, wherein the first liquid is pure water, and
   the second liquid is hydrogen fluoride.

10. The substrate processing apparatus of claim 8, further comprising:
    a liquid surface detector configured to detect a liquid surface within the storage; and
    a controller configured to control the cleaning unit and the switching unit,
    wherein the controller monitors a liquid surface descent time within the storage based on a detection result of the liquid surface detector, and, when the liquid surface descent time exceeds a threshold value, the controller controls the switching unit to switch the flow destination to the storage and controls the cleaning unit to supply the cleaning liquid to the liquid receiving unit.

11. The substrate processing apparatus of claim 8, further comprising:
    a liquid surface detector configured to detect a liquid surface within the storage; and
    a controller configured to control the cleaning unit and the switching unit,
    wherein the controller monitors, based on a detection result of the liquid surface detector, a liquid surface ascent time within the storage in a state that the flow destination is switched to the storage, and, when the liquid surface ascent time exceeds a threshold value, the controller controls the cleaning unit to supply the cleaning liquid to the liquid receiving unit.

12. The substrate processing apparatus of claim 1, further comprising:
- a liquid surface detector configured to detect a liquid surface within the storage; and
- a controller configured to control the cleaning unit and the switching unit,
- wherein the controller monitors a liquid surface descent time within the storage based on a detection result of the liquid surface detector, and, when the liquid surface descent time exceeds a threshold value, the controller controls the switching unit to switch the flow destination to the storage and controls the cleaning unit to supply the cleaning liquid to the liquid receiving unit.

13. The substrate processing apparatus of claim 1, further comprising:
- a liquid surface detector configured to detect a liquid surface within the storage; and
- a controller configured to control the cleaning unit and the switching unit,
- wherein the controller monitors, based on a detection result of the liquid surface detector, a liquid surface ascent time within the storage in a state that the flow destination is switched to the storage, and, when the liquid surface ascent time exceeds a threshold value, the controller controls the cleaning unit to supply the cleaning liquid to the liquid receiving unit.

14. The substrate processing apparatus of claim 1, further comprising:
- a gas purging unit configured to discharge a gas toward an inside of the liquid receiving unit drain line.

15. The substrate processing apparatus of claim 1,
wherein the liquid receiving unit comprises:
- a first liquid receiving unit disposed under the processing tub; and
- a second liquid receiving unit allowed to accommodate therein the processing tub and the first liquid receiving unit, and
- wherein the substrate processing apparatus further comprises an exhaust unit configured to exhaust the second liquid receiving unit.

16. An apparatus cleaning method of cleaning a substrate processing apparatus as claimed in claim 1, the apparatus cleaning method comprising:
- switching the flow destination to the storage from the external drain line by using the switching unit; and
- cleaning the storage with the cleaning liquid by supplying the cleaning liquid to the liquid receiving unit from the cleaning unit after the flow destination is switched to the storage.

* * * * *